United States Patent [19]
Robson

[11] Patent Number: 6,062,063
[45] Date of Patent: May 16, 2000

[54] STEPPER MOTOR HOMING USING A SOFT STOP

[75] Inventor: Randall Jay Robson, Lapeer, Mich.

[73] Assignee: Delphi Technologies, Inc., Troy, Mich.

[21] Appl. No.: 09/255,413

[22] Filed: Feb. 22, 1999

[51] Int. Cl.⁷ .................................................. G01R 17/14
[52] U.S. Cl. ............................................................ 73/1.88
[58] Field of Search .................................. 73/1.88, 866.1, 73/498; 116/291

[56] References Cited

U.S. PATENT DOCUMENTS

| | | | |
|---|---|---|---|
| 5,267,527 | 12/1993 | Totsuka | 116/291 |
| 5,553,480 | 9/1996 | Rose | 116/291 |

Primary Examiner—Robert Raevis
Attorney, Agent, or Firm—Jimmy L. Funke

[57] ABSTRACT

In a preferred embodiment, an instrument display, including: indicator apparatus moveable to indicate a value on a scale; driving apparatus operatively connected to move the indicator apparatus along a path of movement; control apparatus to provide driving signals to the driving apparatus and to cause the driving apparatus to operate at a selected one of a normal torque condition and a reduced torque condition; and soft stop homing apparatus operatively connected to the driving apparatus to cause cessation of movement of the driving apparatus when the driving apparatus is operated at the reduced torque condition and the soft stop homing apparatus is engaged at a homing position and to permit free movement of the driving apparatus when the driving apparatus is operated at the normal torque condition even when the soft stop homing apparatus is engaged.

14 Claims, 3 Drawing Sheets

6,062,063

STEPPER MOTOR HOMING USING A SOFT STOP

BACKGROUND OF THE INVENTION

1. Field of the Invention

The present invention relates to instrument displays generally and, more particularly, but not by way of limitation, to a novel instrument display employing a soft stop for homing.

2. Background Art

While the present invention is described for illustrative purposes only as being applied to a stepper motor driven analog instrument in a vehicle instrument display, it will be understood that it is applicable as well to any instrument display in which it is desirable to avoid using a hard stop for homing.

Instrument displays have been developed which use stepper motors to drive pointers, the pointers indicating, for example, vehicle speed or engine speed. Due to an inherent characteristic of a stepper motor, the stepper motor is in an indeterminate state following power-up. To "orient" the instrument after power-up, the motor is driven against a hard stop, so that the controller knows the position of the stepper motor and, therefore, the position of the pointer from then on until power is removed. This is accomplished by driving the pointer toward the hard stop, or the home position, a distance sufficient to accommodate the worst case pointer position. Typically, the hard stop coincides with the "zero" position of the pointer and may be a pin against which the pointer is driven. After this initial setting of the pointer at the home position, the controller then inferentially knows the position of the pointer.

While the above arrangement is satisfactory for the examples noted, there is interest in adding a instruments which read out values that cover greater than 360 degrees, or greater than a full circle. This presents a problem in that, since the pointer is required to rotate greater than 360 degrees in either direction, there can be no hard stop provided for homing purposes. A possible solution is to employ an optical sensor; however, this would add significant cost to the instrument. A similar problem exists where an instrument does not read out values that cover greater than 360 degrees, but where in instrument requires that the pointer swing either side of a home position.

Accordingly, it is a principal object of the present invention to provide a homing system for stepper motor driven display instrument which homing system does not require the use of a hard stop.

It is a further object of the invention to provide such a homing system that is economical and easily implemented.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, an instrument display, comprising: indicator means moveable to indicate a value on a scale; driving means operatively connected to move the indicator means along a path of movement; control means to provide driving signals to the driving means and to cause the driving means to operate at a selected one of a normal torque condition and a reduced torque condition; and soft stop homing means operatively connected to the driving means to cause cessation of movement of the driving means when the driving means is operated at the reduced torque condition and the soft stop homing means is engaged at a homing position and to permit free movement of the driving means when the driving means is operated at the normal torque condition even when the soft stop means is engaged.

BRIEF DESCRIPTION OF THE DRAWING

Understanding of the present invention and the various aspects thereof will be facilitated by reference to the accompanying drawing figures, provided for purposes of illustration only and not intended to define the scope of the invention, on which.

DETAILED DESCRIPTION OF THE PREFERRED EMBODIMENTS

Figure 1:
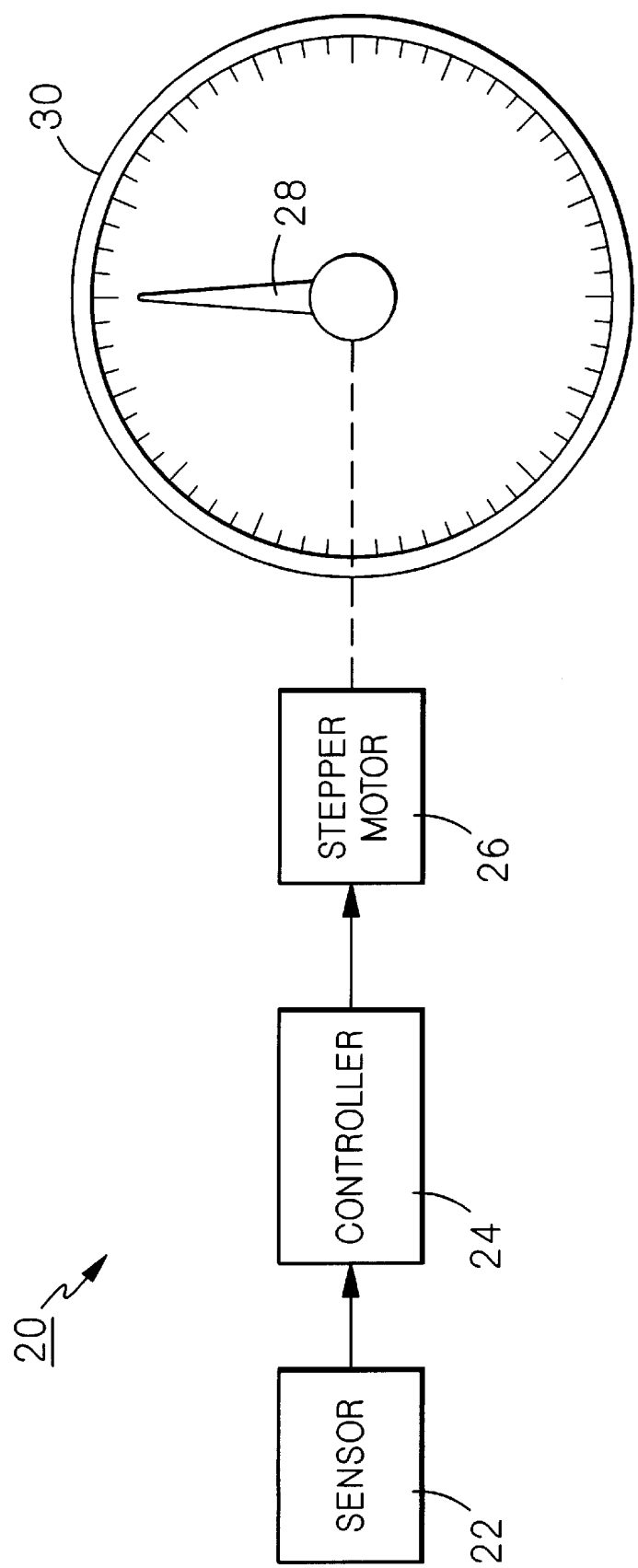
FIG. 1 is a schematic/block diagram of an instrument system employing the present invention.

Reference should now be made to the drawing figures on which similar or identical elements are given consistent identifying numerals throughout the various figures thereof, and on which parenthetical references to figure numbers direct the reader to the view(s) on which the element(s) being described is (are) best seen, although the element(s) may be seen on other figures also.

FIG. 1 illustrates an instrument display system, generally indicated by the reference numeral 20, and employing the present invention. System 20 includes a sensor 22 which may be any of a number of different transducers, such as vehicle speed or motor speed transducers. The output of sensor 22 is inputted to a controller 24 which drives a stepper motor 26. Stepper motor 26 is operatively connected to rotate an instrument pointer 28 to indicate a value on a scale 30. In the case shown, scale 30 covers a full 360 degrees. In other cases, the arc of scale 30 may be less than 360 degrees.

As noted above, in conventional instrument displays, a hard stop (not shown) would be provided, such that, upon startup, pointer 28 would be driven a sufficient distance to engage the pointer against a hard stop at some point in the movement of pointer 28 along scale 30, motion of the pointer would terminate, and controller 24 would know that the pointer was at the homing position.

It has been found that when stepper motor 26 operates under a reduced torque condition, it tends to "slip" quite easily and instrument system 20 can be homed by placing a slight resistance, or a "soft stop", at the homing position, the soft stop not interfering with normal operation when the stepper motor is operated at full torque. Some methods of operating stepper motor 26 at reduced torque include: (1) operating the motor at a high sweep rate so that it has difficulty maintaining magnetic alignment between its stator and its rotor; (2) operating the motor at a reduced drive voltage; or (3) consecutively applying slightly opposing vector voltages to the motor stator windings to effectively reduce the torque. In the case of a typical stepper motor used for instrument displays, such as a Switec stepper motor, satisfactory reduced torque can be achieved by operating the motor at a sweep rate of 600 degrees per second, whereas, in normal operation, the motor is operated at a sweep rate of 300 degrees per second.

Figure 2A:
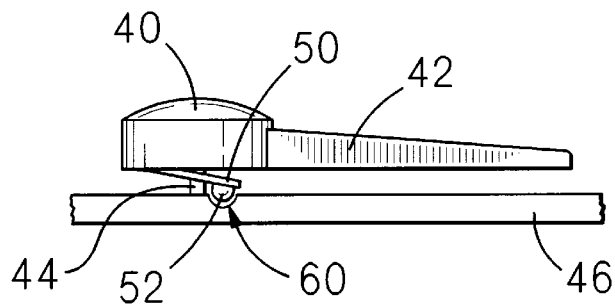
FIG. 2A is a fragmentary side elevational view of one method of providing a soft stop for an instrument pointer.
Figure 2B:
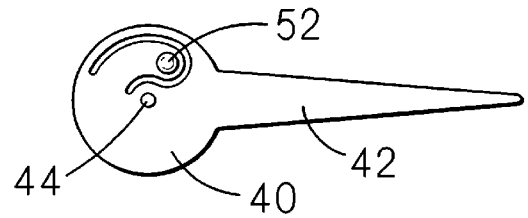
FIG. 2B is a bottom plan view of the instrument pointer of FIG. 2A.

FIGS. 2A and 2B illustrate one method of providing a soft stop for homing of an instrument display. Here, a pointer having a hub 40 and an indicator needle 42 extending therefrom is mounted on a rotatable shaft 44 which extends through a panel 46, the shaft being operatively connected to a stepper motor (not shown) such as stepper motor 26 (FIG. 1). Panel 46 may be assumed to be, for example, the end plate of a stepper motor or a trim panel behind which the stepper motor is disposed. A spring 50 has its proximal end attached to the lower surface of hub 40 and has formed at its distal end a ball shaped member 52. A circular detent 60 is defined in the upper surface of panel 46 in the circular path defined by the movement of ball shaped member 52 such as to engage the ball shaped member at some point in the path of travel of the ball shaped member as the ball shaped member rotates with hub 40. Spring 50, ball shaped member 52, and detent 60 are selected such that engagement of the ball shaped member and the detent provides a soft stop sufficient to arrest rotation of shaft 44 when the stepper motor is operated at a reduced torque condition, but which engagement is insufficient to interfere with normal torque operation of the stepper motor.

Figure 3A:
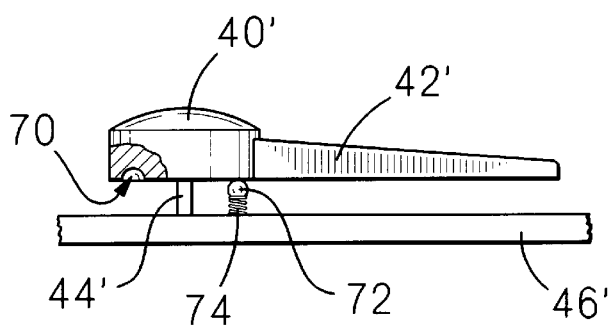
FIG. 3A is a fragmentary side elevational view, partially cutaway, of another method of providing a soft stop for an instrument pointer.
Figure 3B:
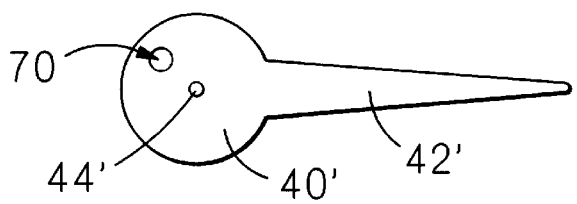
FIG. 3B is a bottom plan view of the instrument pointer of FIG. 3A.

FIGS. 3A and 3B illustrate another arrangement for providing a soft stop for homing of an instrument display, the elements on FIGS. 3A and 3B having structure and function identical to those of the elements on FIGS. 2A and 2B being given primed reference numerals. Here, a detent 70 is provided on the lower surface of hub 40' and a complementary ball 72 and a spring 74 are provided on the upper surface of panel 46' such that the ball will engage the detent at some point in the rotation of the hub. As was the case with FIGS. 2A and 2B, detent 70, ball 72, and spring 74 are selected such that engagement of the ball and the detent provides a soft stop sufficient to arrest rotation of shaft 44' when the stepper motor is operated at a reduced torque condition, but which engagement is insufficient to interfere with normal torque operation of the stepper motor.

Figure 4A:
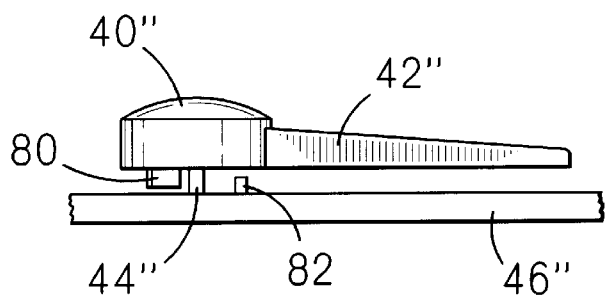
FIG. 4A is a fragmentary side elevational view of a further method of providing a soft stop for an instrument pointer.
Figure 4B:
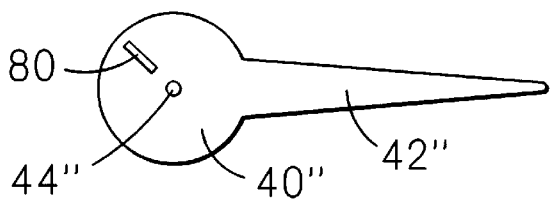
FIG. 4B is a bottom plan view of the instrument pointer of FIG. 4A.

FIGS. 4A and 4B illustrate yet another arrangement for providing a soft stop for homing of an instrument display, the elements on FIGS. 4A and 4B having structure and function identical to those of the elements on FIGS. 2A and 2B being given double primed reference numerals. Here, a pliable flag 80 depends from the lower surface of hub 40" and a complementary post 82 rises from the upper surface of panel 46" such that the flag will engage the post at some point in the rotation of the hub. As above, flag 80 and post 82 are selected such that engagement of the flag and the post provides a soft stop sufficient to arrest rotation of shaft 44" when the stepper motor is operated at a reduced torque condition, but which engagement is insufficient to interfere with normal torque operation of the stepper motor.

Figure 5A:
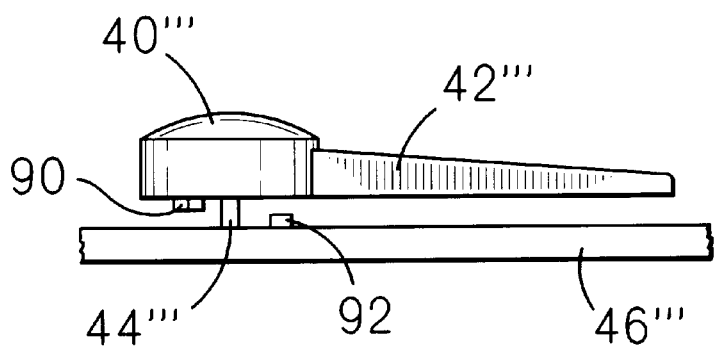
FIG. 5A is a fragmentary side elevational view of an additional method of providing a soft stop for an instrument pointer.
Figure 5B:
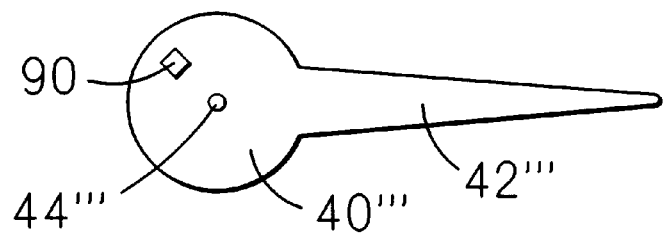
FIG. 5B is a bottom plan view of the instrument pointer of FIG. 5A.

FIGS. 5A and 5B illustrate an additional arrangement for providing a soft stop for homing of an instrument display, the elements on FIGS. 5A and 5B having structure and function identical to those of the elements on FIGS. 2A and 2B being given triple primed reference numerals. Here, a piece of ferromagnetic material 90 depends from the lower surface of hub 40'" and a complementary magnet 92 is fixed to the upper surface of panel 46'" such that, at some point in the rotation of pointer 42'", the ferromagnetic material and the magnetic will magnetically interact. As above, the magnetic attraction of ferromagnetic material 90 and magnet 92 is selected such that the magnetic engagement of the ferromagnetic material and the magnet provides a soft stop sufficient to arrest rotation of shaft 44'" when the stepper motor is operated at a reduced torque condition, but which engagement is insufficient to interfere with normal torque operation of the stepper motor.

Referring primarily to FIG. 1, in operation on power-up, controller 24 provides driving signals to stepper motor 26 to rotate 360 degrees, or some other distance, in a selected direction at a reduced torque condition. At some point in the rotation, say at the 0-degree position, for example, a soft stop condition is reached (FIGS. 2A–5B), and stepper motor 26 "slips" for the remainder of what would be the driven rotation, with pointer 28 remaining at the homing position of 0 degrees. At the end of the time for the selected rotation to take place, controller 24 now knows that pointer 28 is pointing to 0 degrees on scale 30, receives an input from sensor 22 representative of actual value sensed, and drives stepper motor 26 at normal torque to rotate the pointer to the correct indication of the value sensed. Since stepper motor 26 is now operating at normal torque condition, further engagement(s) of the soft stop during normal operation are transparent to the stepper motor.

It will be understood that the examples of soft stop mechanisms shown on FIGS. 2A–4B are illustrative only and it is within the contemplation of the present invention that the soft stop may be applied radially or axially anywhere in the drive mechanism by techniques readily applied by those having ordinary skill in the art, including providing a soft stop mechanism within stepper motor 26 (FIG. 1).

In the embodiments of the present invention described above, it will be recognized that individual elements and/or features thereof are not necessarily limited to a particular embodiment but, where applicable, are interchangeable and can be used in any selected embodiment even though such may not be specifically shown. Terms such as "upper", "lower", "inner", "outer", "inwardly", "outwardly", and the like, when used herein, refer to the positions of the respective elements shown on the accompanying drawing figures and the present invention is not necessarily limited to such positions.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be the to fall therebetween. The embodiments of the invention in which an exclusive property or privilege is claimed are defined as follows:

1. An instrument display, comprising:
 (a) indicator means moveable to indicate a value on a scale;
 (b) driving means operatively connected to move said indicator means along a path of movement;
 (c) control means to provide driving signals to said driving means and to cause said driving means to operate at a selected one of a normal torque condition and a reduced torque condition; and
 (d) soft stop homing means operatively connected to said driving means to cause cessation of movement of said driving means when said driving means is operated at said reduced torque condition and said soft stop homing means is engaged at a homing position and to permit free movement of said driving means when said driving means is operated at said normal torque condition even when said soft stop homing means is engaged.

2. An instrument display, as defined in claim 1, wherein: said driving means is a stepper motor.

3. An instrument display, as defined in claim 2, wherein: said soft stop homing means is disposed within said stepper motor.

4. An instrument display, as defined in claim 1, wherein: said soft stop homing means is disposed at a point along said path of movement.

5. An instrument display, as defined in claim 4, wherein: said soft stop homing means is disposed between said indicating means and a surface immovable with respect to said indicating means.

6. An instrument display, as defined in claim 1, wherein: said soft stop homing means is a mechanical detent mechanism.

7. An instrument display, as defined in claim 1, wherein: said soft stop homing means is a magnetic detent mechanism.

8. A method of operating an instrument display of said type having indicator means moveable to indicate a value on a scale, driving means operatively connected to move said indicator means along a path of movement, control means to provide driving signals to said driving means and to cause said driving means to operate at a selected one of a normal torque condition and a reduced torque condition, and soft stop homing means operatively connected to said driving means to cause cessation of movement of said driving means when said driving means is operated at said reduced torque condition and said soft stop homing means is engaged at a homing position and to permit free movement of said driving means when said driving means is operated at said normal torque condition even when said soft stop homing means is engaged, said method comprising:
 (a) beginning at a power-up condition, said control means providing driving signals to said driving means to cause said driving means to operate at said reduced torque condition and to command said driving means to move a predetermined degree of motion in a predetermined period of time;
 (b) said soft stop homing means becoming engaged at some point in said degree of motion so as to cause motion of said driving means to cease;
 (c) when said predetermined period of time ends, said control means causing said driving means to operate at said normal torque condition, such that further engagement(s) of said soft stop homing means will not affect motion of said driving means.

9. A method of operating an instrument display, as defined in claim 8, further comprising: providing said driving means as a stepper motor.

10. A method of operating and instrument display, as defined in claim 9, further comprising: providing said soft stop homing means disposed within said stepper motor.

11. A method of operating an instrument display, as defined in claim 8, further comprising: providing said soft stop homing means disposed at a point along said path of movement.

12. A method of operating an instrument display, as defined in claim 11, further comprising: providing said soft stop homing means disposed between said indicating means and a surface immovable with respect to said indicating means.

13. A method of operating an instrument display, as defined in claim 8, further comprising: providing said soft stop homing means as a mechanical detent mechanism.

14. A method of operating an instrument display, as defined in claim 8, further comprising: providing said soft stop homing means as a magnetic detent mechanism.

\* \* \* \* \*